United States Patent
Nozawa et al.

(10) Patent No.: US 7,481,944 B2
(45) Date of Patent: Jan. 27, 2009

(54) ETCH AMOUNT DETECTION METHOD, ETCHING METHOD, AND ETCHING SYSTEM

(75) Inventors: Syuji Nozawa, Yamanashi (JP); Katsuhiro Nishimaki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 844 days.

(21) Appl. No.: 10/860,012

(22) Filed: Jun. 4, 2004

(65) Prior Publication Data
US 2005/0029228 A1    Feb. 10, 2005

(30) Foreign Application Priority Data
Jun. 5, 2003    (JP) .............................. 2003-160658

(51) Int. Cl.
*G01L 21/30* (2006.01)
*G01B 9/02* (2006.01)
(52) U.S. Cl. ............................... 216/60; 216/58; 216/59
(58) Field of Classification Search ................... 216/58, 216/59, 60
See application file for complete search history.

(56) References Cited

U.S. PATENT DOCUMENTS

| | | | |
|---|---|---|---|
| 6,210,593 B1 * | 4/2001 | Ohkuni et al. | 216/59 |
| 6,448,094 B2 * | 9/2002 | Yamazawa et al. | 438/9 |
| 6,585,908 B2 * | 7/2003 | Cardoso et al. | 216/60 |

FOREIGN PATENT DOCUMENTS

JP    2-71517    3/1990

* cited by examiner

*Primary Examiner*—Shamim Ahmed
(74) *Attorney, Agent, or Firm*—Finnegan, Henderson, Farabow, Garrett & Dunner, LLP

(57) ABSTRACT

This invention accurately detects an etch amount of an etching target layer irrespective of a type of a mask layer. A light La is reflected by an upper surface of a photoresist mask layer 316 and a bottom of a hole H. Thereby a reflected light La1 and a reflected light La2 are obtained. The reflected lights La1 and La2 interfere with each other, thereby generating an interference light Lai. A light Lb is reflected by an interface between the photoresist mask layer 316 and a polysilicon film 304, and the upper surface of the photoresist mask layer 316. Thereby a reflected light Lb1 and a reflected light Lb2 are obtained. The reflected lights Lb1 and Lb2 interfere with each other, thereby generating an interference light Lb1. Using the interference lights Lai and Lbi, an etch amount of the polysilicon film 304 is calculated.

12 Claims, 6 Drawing Sheets

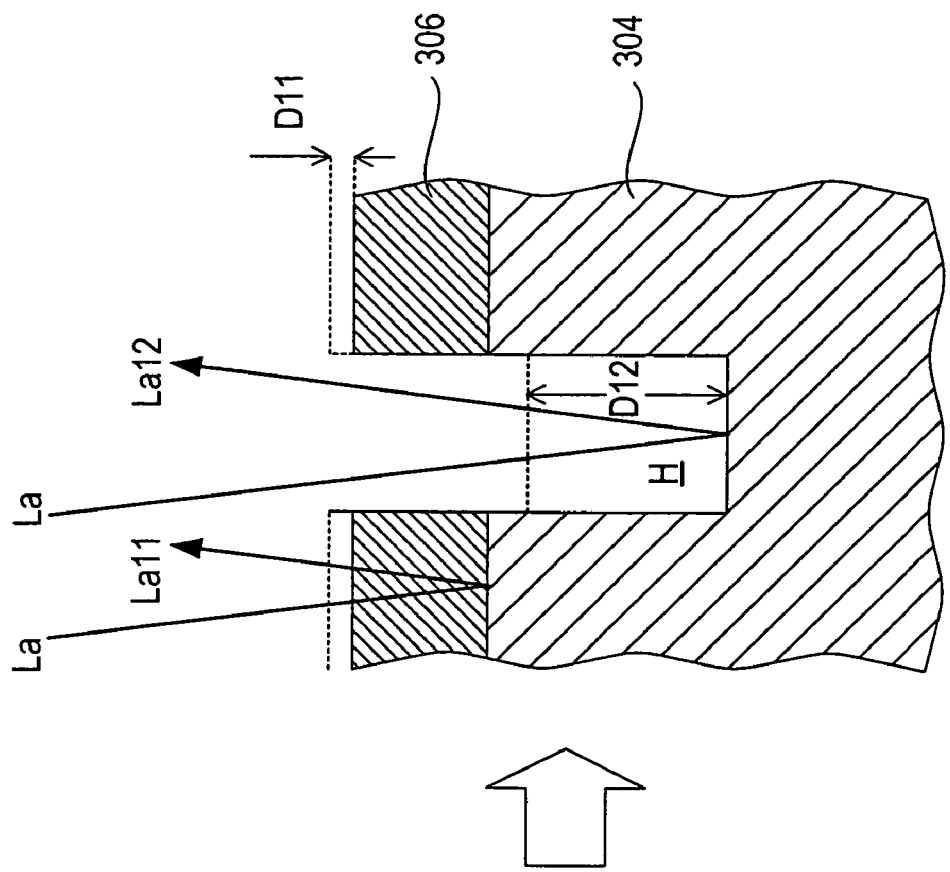
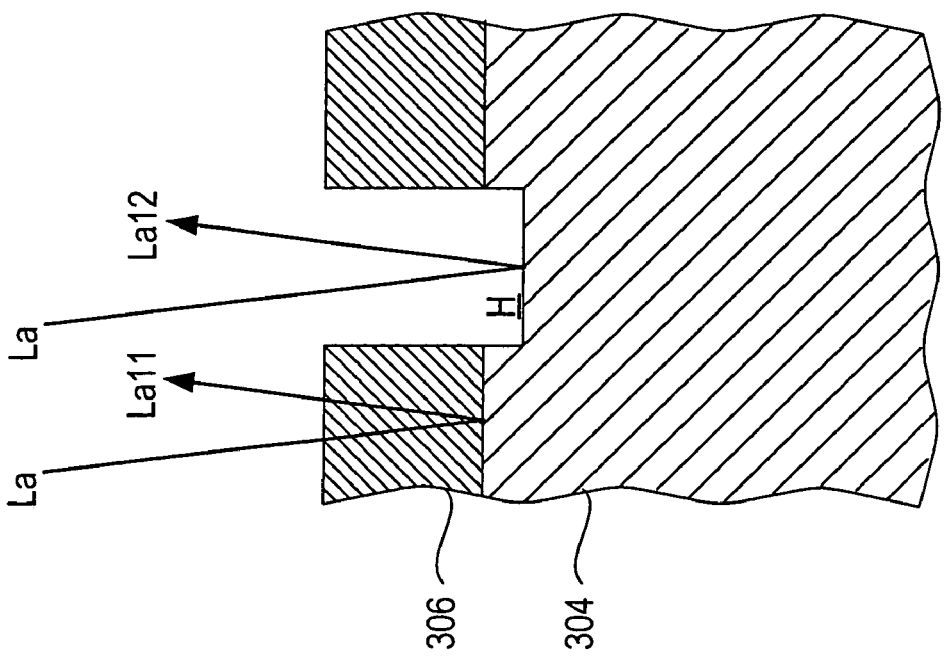

ETCH AMOUNT DETECTION METHOD, ETCHING METHOD, AND ETCHING SYSTEM

BACKGROUND OF THE INVENTION

1. Field of the Invention

The present invention relates to an etch amount detection method, an etching method, and an etching system.

2. Description of the Related Art

An etching process using plasma is conventionally, widely applied to semiconductor manufacturing process or an LCD substrate manufacturing process. An etching system employed for this etching process includes, for example, an upper electrode and a lower electrode provided in a treatment chamber to be parallel to each other. An object to be processed such as a semiconductor wafer is mounted on the lower electrode, a plasma is generated in an etching gas by electron discharge between the upper electrode and the lower electrode, and an etching target layer is etched using a mask layer patterned into a predetermined shape.

As one of methods for monitoring an etched state of the etching target layer, an emission spectrum analysis method is proposed. This is a method for detecting a point at which a specific wavelength is changed as an etching end point in an emission spectrum of the gas generated by the etching. With this method, an etch depth (an etch amount) of the etching target layer cannot be known.

Japanese Patent Laid-open Publication No. 2-71517, for example, discloses an etching system capable of detecting an etch amount. With this etching system, a light having a predetermined wavelength is emitted from a light source outside of a treatment chamber, and this light is irradiated onto an object to be processed through an observation window provided at an outer electrode. A part of this irradiated light is reflected by an interface between a mask layer and an etching target layer, whereas the other part of the irradiated light is reflected by a bottom of an etching target portion (an etching hole or an etching groove) of the etching target layer. An interference light (interference wave) generated by the two reflected lights is detected and photoelectrically converted into an electric signal by a detector. The resultant electric signal is amplified and digitized, and then subjected to a frequency analysis by a waveform analysis means. The etch amount is calculated based on a frequency distribution of the interference wave obtained as a result of these signal processings.

With the technique disclosed in the Japanese Patent Laid-open Publication No. 2-71517, however, the etch amount cannot be sometimes detected accurately, depending on a type of the mask layer. If the mask layer has a high absorption coefficient relative to the wavelength of the light emitted from the light source, for example, then the light emitted from the light source is not transmitted by the mask layer, and the reflected light reflected by the interface between the mask layer and the etching target layer cannot be obtained. If the reflected light reflected by the interface cannot be obtained, it is difficult to calculate the etch amount of the etching target layer.

If the reflected light reflected by the interface between the mask layer and the etching target layer cannot be obtained, attention may be paid to a reflected light reflected by an upper surface of the mask layer instead of the reflected light from the interface. If so, an interference wave between this reflected light and the reflected light reflected by the bottom of the etching target portion of the etching target layer is detected. In this case, however, it is necessary to select a constituent material of the mask layer for the following reason, in order to become larger a selected ratio between the mask layer and the etching target layer. If the mask layer is etched while the etching target layer is etched, then a height of the upper surface of the mask layer which should be a reference surface is reduced from a height when etching starts, and the etch amount of the etching target layer cannot be accurately calculated.

SUMMARY OF THE INVENTION

The present invention has been achieved in light of the conventional disadvantages. It is an object of the present invention to provide an etch amount detection method, an etching method, and an etching system which are novel and improved, and which can accurately detect an etch amount of an etching target layer, irrespective of a type of a mask layer.

To attain the object, according to a first aspect of the present invention, there is provided an etch amount detection method for detecting an etch amount of an etching target layer when an etching process is carried out to the etching target layer on an object to be processed while using a patterned mask layer as a mask. This etch amount detection method is characterized by including steps of: irradiating a first light having a first wavelength and a second light having a second wavelength different from the first wavelength onto the object to be processed; detecting a first interference light generated by interference of a first reflected light obtained when the first light is reflected by a surface of the mask layer with a second reflected light obtained when the first light is reflected by a bottom of an etching target portion etched of the etching target layer; detecting a second interference light generated by interference of a third reflected light obtained when the second light is reflected by the surface of the mask layer with a fourth reflected light obtained when the second light is reflected by an interface between the mask layer and the etching target layer; and calculating an etch amount of the etching target portion based on the first interference light and the second interference light.

To attain the object, according to a second aspect of the present invention, there is provided an etching method for etching an etching target layer on an object to be processed while using a patterned mask layer as a mask. This etching method is characterized by including steps of: irradiating a first light having a first wavelength and a second light having a second wavelength different from the first wavelength onto the object to be processed; detecting a first interference light generated by interference of a first reflected light obtained when the first light is reflected by a surface of the mask layer with a second reflected light obtained when the first light is reflected by a bottom of an etching target portion etched of the etching target layer; detecting a second interference light generated by interference of a third reflected light obtained when the second light is reflected by the surface of the mask layer with a fourth reflected light obtained when the second light is reflected by an interface between the mask layer and the etching target layer; and calculating an etch amount of the etching target portion based on the first interference light and the second interference light.

According to the etch amount detection method and the etching method, the wavelength (first wavelength) of the first light and the wavelength (second wavelength) of the second light can be adjusted according to the type of the mask layer, and the first interference light and the second interference light can be accurately detected. As a result, irrespective of the type of the mask, the etch amount of the etching target portion can be calculated with high accuracy.

In addition, it is preferable that the step of calculating the etch amount of the etching target portion based on the first interference light and the second interference light includes steps of: calculating a difference in height between the surface of the mask layer and the bottom of the etching target portion based on the first interference light; calculating an etch amount of the mask layer based on the second interference light; and adding the etch amount of the mask layer to the difference in height between the surface of the mask layer and the bottom of the etching target portion. According to this method, the etch amount of the etching target portion can be easily calculated.

To attain the object, according to a third aspect of the present invention, there is provided an etching system for carrying out an etching process to an etching target layer on an object to be processed while using a patterned mask layer as a mask. This etching system includes a light source, a light detection section, and an operation section. The light source irradiates a first light having a first wavelength and a second light having a second wavelength different from the first wavelength onto the object to be processed. The light detection section detects a first interference light generated by interference of a first reflected light obtained when the first light is reflected by a surface of the mask layer with a second reflected light obtained when the first light is reflected by a bottom of an etching target portion etched of the etching target layer, and detects a second interference light generated by interference of a third reflected light obtained when the second light is reflected by the surface of the mask layer with a fourth reflected light obtained when the second light is reflected by an interface between the mask layer and the etching target layer. The operation section calculates an etch amount of the etching target portion based on the first interference light and the second interference light.

According to this etching system, the light source adjusts the wavelength (first wavelength) of the first light and the wavelength (second wavelength) of the second light according to the type of the mask layer, respectively, and irradiates the first light and the second light onto the object to be processed. The light detection section can, therefore, accurately detect the first interference light and the second interference light. The operation section can calculate the etch amount of the etching target portion with high accuracy.

Furthermore, it is preferable that the operation section calculates the etch amount of the etching target portion by: calculating a difference in height between the surface of the mask layer and the bottom of the etching target portion based on the first interference light, calculating an etch amount of the mask layer based on the second interference light, and adding the etch amount of the mask layer to the difference in height between the surface of the mask layer and the bottom of the etching target portion. With this constitution, the etch amount of the etching target portion can be easily calculated.

If the mask layer consists of a photosensitive material, it is preferable that the first wavelength is smaller than a photosensitive wavelength of the photosensitive material, and that the second wavelength is larger than the photosensitive wavelength of the photosensitive material. It is thereby possible to more accurately calculate the difference in height between the surface of the mask layer and the bottom of the etching target portion based on the first interference light. In addition, the second light can be transmitted by the mask layer, and reflected by the interface between the mask layer and the etching target layer.

The etching target layer may consist of a silicon-containing film.

In the present specification, it is assumed that 1 mTorr is $(10^{-3} \times 101325/760)$ Pa, and 1 sccm is $(10^{-6}/60)$ m$^3$/sec.

BRIEF DESCRIPTION OF THE DRAWINGS

FIGS. 5A and 5B are explanatory views which depict light reflection states when the polysilicon film of the wafer shown in FIG. 3 is etched;

DETAILED DESCRIPTION OF THE PREFERRED EMBODIMENT

A preferred embodiment of the present invention will be described hereinafter in detail with reference to the accompanying drawings. In the present specification and drawings, constituent elements substantially equal in functional configuration will be denoted by the same reference symbols and not described repeatedly.

(Etching System)

Figure 1:
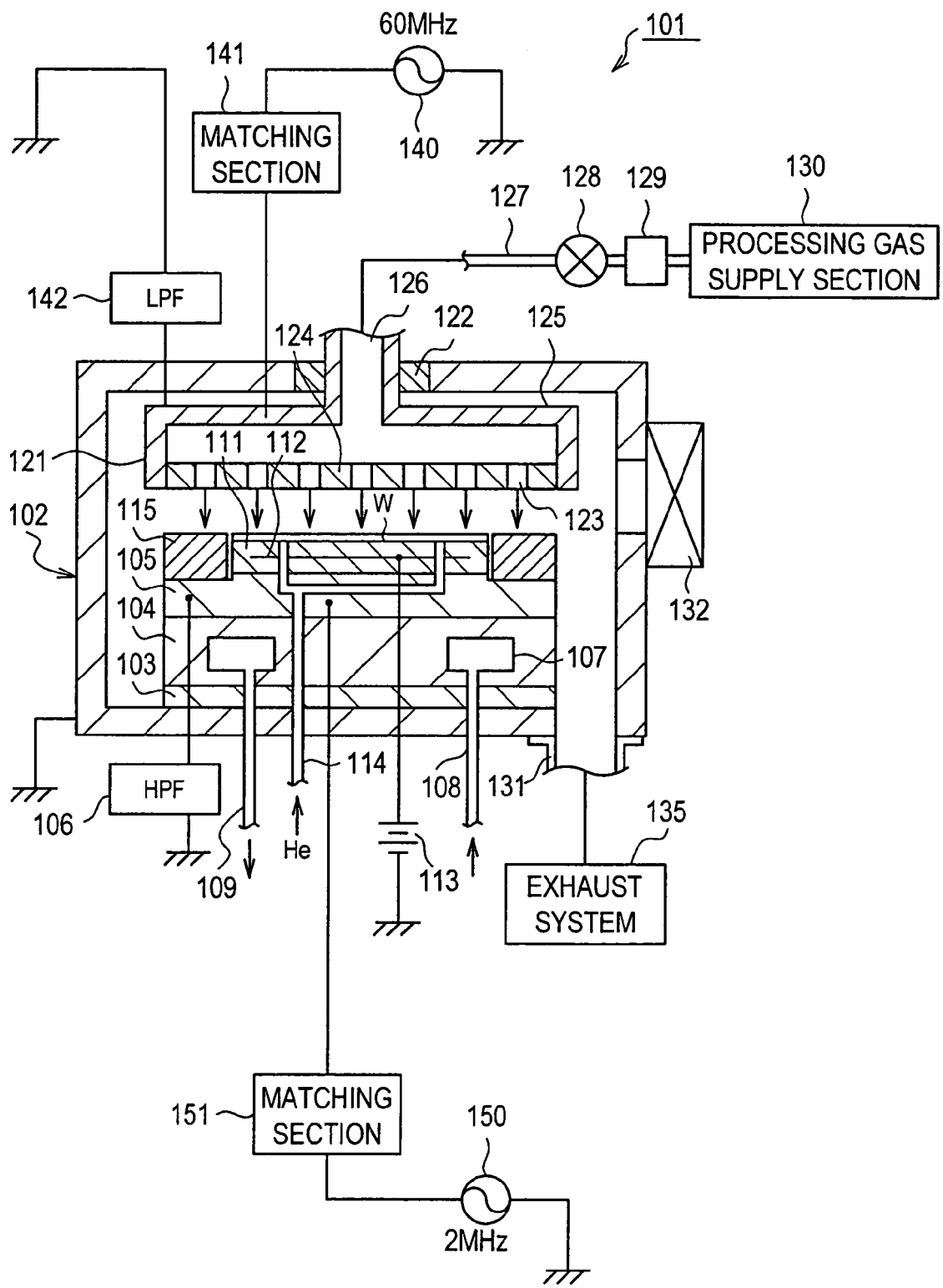
FIG. 1 is a schematic block diagram of an etching system according to one embodiment of the present invention.

FIG. 1 shows schematic configuration of a parallel plate plasma etching system 101 as one example of an etching system according to the embodiment.

This etching system 101 includes a chamber (treatment vessel) 102 which is formed into a cylinder having a surface consisting of aluminum subjected to, for example, an anodic oxidation treatment (alumite treatment). This chamber 102 is grounded. A generally cylindrical susceptor support base 104 for mounting thereon a wafer W through an insulating plate 103 such as a ceramic plate is provided on a bottom in the chamber 102. A susceptor 105 that constitutes a lower electrode is provided on this susceptor support base 104. A high-pass filter (HPF) 106 is connected to the susceptor 105.

Temperature adjustment medium chambers 107 are provided within the susceptor support base 104. A temperature adjustment medium is introduced into each temperature adjustment medium chamber 107 through an inlet tube 108, circulated in the temperature adjustment medium chamber 107, and discharged from a discharge tube 109. By thus circulating the temperature adjustment medium, a temperature of the susceptor 105 can be controlled to a desired temperature.

The susceptor 105 is formed so that an upper central portion is of a convex disk shape, and an electrostatic chuck 111 generally equal in shape to the wafer W is provided on the susceptor 105. The electrostatic chuck 111 is constituted to interpose an electrode 112 between insulating materials. A DC current of, for example, 1.5 kV is applied from a DC power supply 113 connected to the electrode 112, to the electrostatic chuck 111. The wafer W is thereby electrostatically attracted by the electrostatic chuck 111.

A gas passage 114 is formed in the insulating plate 103, the susceptor support base 104, the susceptor 105, and the electrostatic chuck 111 for supplying a heating medium (a backside gas such as He gas) to a rear surface of the wafer W serving as an object to be processed. A heat is transferred between the susceptor 105 and the wafer W through this heating medium, thereby keeping the wafer W at a predetermined temperature.

An annular focus ring 115 is arranged in a peripheral portion of an upper end of the susceptor 105 so as to surround the wafer W mounted on the electrostatic chuck 111. This focus ring 115 consists of an insulating material such as ceramics or quartz, or a conductive material. By arranging the focus ring 115, etching uniformity is improved.

An upper electrode 121 is provided above the susceptor 105 to face the susceptor 105 and to be parallel with the susceptor 105. This upper electrode 121 is supported by an interior of the chamber 102 through an insulating material 122. The upper electrode 121 is composed of an electrode plate 124 which constitutes a surface that faces the susceptor 105 and which includes a plurality of discharge holes 123, and an electrode support 125 which supports this electrode plate 124. The electrode plate 124 consists of, for example, quartz and the electrode support 125 consists of, for example, a conductive material having an alumite-treated surface such as aluminum. A distance between the susceptor 105 and the upper electrode 121 is made adjustable.

A gas inlet 126 is provided at a center of the electrode support 125 of the upper electrode 121. A gas supply tube 127 is connected to this gas inlet 126. A treatment gas supply source 130 is connected to this gas supply tube 127 through a valve 128 and a mass flow controller 129.

An etching gas for plasma etching is supplied from the treatment gas supply source 130. In FIG. 1, only one treatment gas supply system composed of the gas supply tube 127, the valve 128, the mass flow controller 129, the treatment gas supply source 130, and the like is shown. However, the etching system 101 actually includes a plurality of treatment gas supply systems. For example, etching gases such as $CF_4$, $O_2$, $N_2$, and $CHF_3$ are flow-controlled independently of one another, and supplied into the chamber 102.

An exhaust tube 131 is connected to the bottom of the chamber 102. An exhaust system 135 is connected to this exhaust tube 131. The exhaust system 135 includes a vacuum pump such as a turbo molecular pump, and regulates an internal atmosphere of the chamber 102 to a predetermined reduced-pressure atmosphere (e.g., 0.67 Pa or less). A gate valve 13 is provided on a sidewall of the chamber 102. By opening this gate valve 132, the wafer W can be transported into and out of the chamber 102. A wafer cassette, for example, is employed to transport the wafer W.

A first radio frequency power source 140 is connected to the upper electrode 121, and a first matching section 141 is inserted into a feeding line of the first radio frequency power source 140. A low-pass filter (LPF) 142 is connected to the upper electrode 121. The first radio frequency power source 140 can output a power at a frequency from 50 to 150 MHz. By applying the power at such a high frequency to the upper electrode 121, a plasma which is in a favorable dissociation state and which has a high density can be formed within the chamber 102, thereby enabling a plasma treatment under lower pressure conditions than those for the conventional system. The frequency of the output power of the first radio frequency power source 140 is preferably 50 to 80 MHz, and typically adjusted to 60 MHz or a frequency near 60 MHz as shown in FIG. 1.

A second radio frequency power source 150 is connected to the susceptor 105 serving as the lower electrode, and a second matching section 151 is inserted into a feeding line of the second radio frequency power source 150. This second radio frequency power source 150 can output a power at a frequency in a range of several hundred kilohertz to a few tens of megahertz. By applying the power in such a frequency range to the susceptor 105, an appropriate ionic action can work on the object to be processed wafer W without damaging the wafer W. The frequency of the output power of the second radio frequency power source 150 is typically adjusted to 2 MHz, 13.67 MHz, or the like as shown in FIG. 1.

(Etch Amount Detecting Apparatus)

Figure 2:
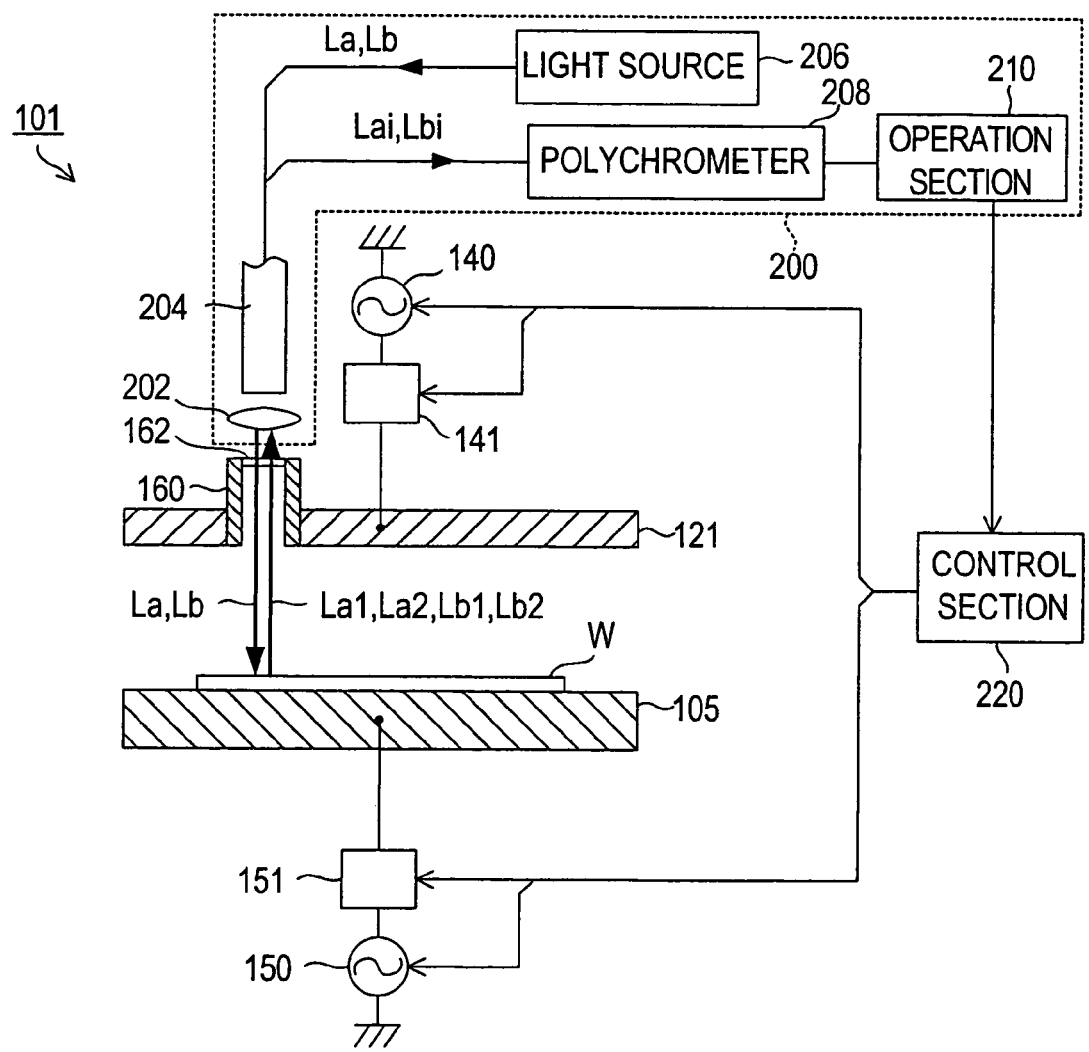
FIG. 2 is a block diagram which depicts an example of configuration of an etch amount detecting apparatus included in the etching system shown in FIG. 1.

The etching system 100 according to this embodiment also includes an etch amount detecting apparatus 200 as shown in FIG. 2. This etch amount detecting apparatus 200 is composed of a condenser lens 202, an optical fiber 204, a light source 206, a polychrometer (photodetector) 208, and an operation section 210. The light source 206 is composed of, for example, a xenon lamp, a tungsten lamp, one of various lasers, or a combination of these lamps and lasers. The light source 206 can emit a light La or at least two lights La and Lb having different wavelengths.

The upper electrode 121 is provided with a cylindrical observation section 160. A window section 162 consisting of, for example, quartz glass is provided on an upper end of the observation section 160. The observation section 160 is optically connected to the light source 206 and the polychrometer 208 by the condenser lens 202 and the optical fiber 204 which are provided to face the window section 162.

The lights La and Lb emitted from the light source 206 are passed through the optical fiber 204 and irradiated onto the wafer W via the observation section 160. When the light La is reflected by a plurality of portions having different heights of the wafer W, a plurality of reflected lights (e.g., reflected lights La1 and La2) interfere with each other to generate an interference light Lai. Likewise, when the light Lb is reflected by a plurality of portions having different heights of the wafer W, a plurality of reflected lights (e.g., reflected lights Lb1 and Lb2) interfere with each other to generate an interference light Lbi. The interference lights Lai and Lbi are passed through the optical fiber 204, reach the polychrometer 208, and are detected by the polychrometer 208.

The operation section 210 calculates an etch amount of an etching target layer of the wafer W based on changes in intensities of the respective interference lights Lai and Lbi detected by the polychrometer 208. A control section 220 controls the first radio frequency power source 140, the first matching section 141, the second radio frequency power source 150, and the second matching section 151 according to an operation result of the operation section 210. It is thereby possible to adjust an etch rate at which the etching target layer is etched, and to stop etching the etching target layer. Detailed operations of the etch amount detecting apparatus 200 will be described later.

(Film Structure of Wafer)

A specific example of a film structure of the wafer employed for the etch amount detection method according to this embodiment will next be described with reference to FIGS. 3 and 4.

Figure 3:
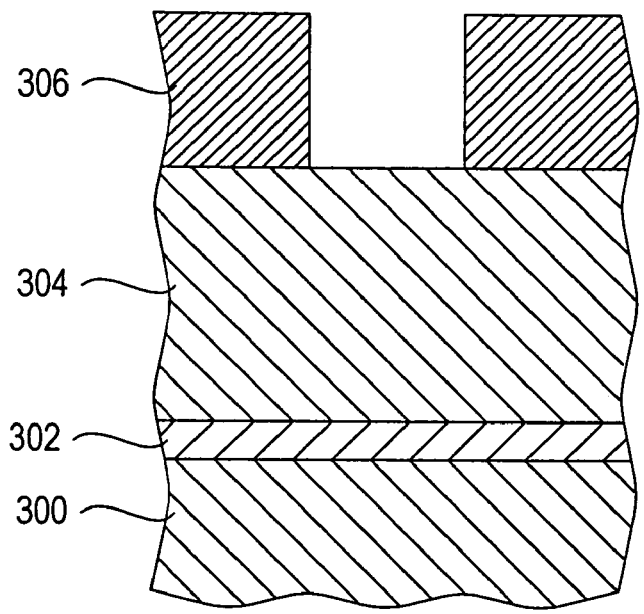
FIG. 3 is a schematic cross-sectional view which depicts film configuration of a wafer which includes a hard mask layer applied to the embodiment.
Figure 4:
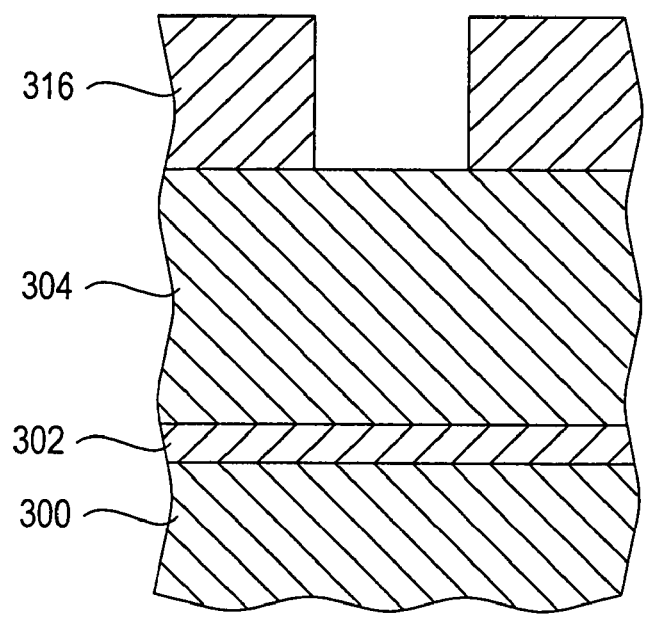
FIG. 4 is a schematic cross-sectional view which depicts film configuration of a wafer which includes a photoresist mask layer applied to the embodiment.

The difference between the film structure shown in FIG. 3 and that shown in FIG. 4 is a mask formed on a polysilicon film 304 that is the etching target layer. Namely, the film structure shown in FIG. 3 includes a mask layer 306 consisting of a silicon oxide material ($SiO_2$) or a silicon nitride material ($Si_3N_4$), whereas the film structure shown in FIG. 4 includes a mask layer 316 consisting of a photoresist material (photosensitive material).

The film structure including the mask layer 306 consisting of the silicon oxide material ($SiO_2$) or the silicon nitride material ($Si_3N_4$) shown in FIG. 3 is formed as follows.

A gate oxide film (e.g., an $SiO_2$ film) 302 is formed on an upper surface of a silicon substrate 300 having a diameter of, for example, 200 mm.

The polysilicon film 304 serving as the etching target layer is formed on an entire surface of the gate oxide film 302.

The silicon oxide material ($SiO_2$) or the silicon nitride material ($Si_3N_4$) is deposited on the polysilicon film 304, and a photoresist material is coated on the deposited silicon oxide material ($SiO_2$) or silicon nitride material ($Si_3N_4$), thereby forming a photoresist film (not shown).

Using photolithography, the photoresist film is patterned into a predetermined shape, thereby forming a photoresist mask (not shown). Using this photoresist mask, the silicon oxide material ($SiO_2$) or the silicon nitride material ($Si_3N_4$) deposited on the polysilicon film 304 is selectively etched away, thereby forming the mask layer 306. The mask layer 306 consisting of the silicon oxide material ($SiO_2$) or the silicon nitride material ($Si_3N_4$) has a high etch selectivity relative to the polysilicon film 304. This mask layer will be referred to as "hard mask layer" 306 hereinafter.

Through these steps, the wafer having the film structure shown in FIG. 3 is obtained. The film structure including the mask layer 316 consisting of the photoresist material as shown in FIG. 4 is formed as follows.

A gate oxide film (e.g., an $SiO_2$ film) 302 is formed on an upper surface of a silicon substrate 300 having a diameter of, for example, 200 mm.

The polysilicon film 304 serving as the etching target layer is formed on an entire surface of the gate oxide film 302.

The photoresist material is coated on the polysilicon film 304, thereby forming a photoresist film.

Using photolithography, the photoresist film is patterned into a predetermined shape, thereby forming the mask layer 316. This mask layer 316 will be referred to as "photoresist mask layer" 316 hereinafter.

Through these steps, the wafer having the film structure shown in FIG. 4 is obtained.

According to this embodiment, the etching process can be carried out to both of the wafers different in the type of the mask layer as shown in FIGS. 3 and 4, and the etch amounts can be detected during the etching process. This embodiment is, however, mainly characterized by an etching process operation during the etching process carried out to the wafer including the photoresist mask layer 316 shown in FIG. 4, and by the configuration of the apparatus related to this etch amount detecting operation. With a view of making this character of the embodiment clearer, an etching process operation carried out to the wafer including the hard mask layer 306 shown in FIG. 3 and the etch amount detecting operation carried out in parallel to the etching process operation will first be described. Thereafter, to compare these operations for the wafer shown in FIG. 3, the etching process operation carried out to the wafer including the photoresist mask layer 316 shown in FIG. 4 and the etch amount detecting operation carried out in parallel to the etching process operation will be described.

(Etching Process when Mask Layer is Hard Mask Layer)

First, an etching process is carried out to the wafer shown in FIG. 3 so as to remove a native oxide on an exposed surface of the polysilicon film 304 using a mixture gas containing at least $CF_4$ and $O_2$ ("breakthrough etching step").

Conditions for this breakthrough etching step are, for example, an internal pressure of the chamber 102 of 10 mTorr, the distance between the upper electrode 121 and the susceptor 105 of 140 millimeters, and a $CF_4/O_2$ gas flow ratio (a gas flow of $CF_4$ to gas flow of $O_2$) of 134 sccm/26 sccm. In addition, a voltage applied to the electrostatic chuck 110 for attracting the wafer W thereon is set at 2.5 kV, and a pressure of a cooling gas for cooling the rear surface of the wafer W is set at 3 mTorr both at a center and an edge of the rear surface. As for settings of temperatures in the chamber 102, the temperature of the lower electrode is set at 75° C., that of the upper electrode is set at 80° C., and that of the sidewall is set at 60° C.

In the breakthrough etching step, high-frequency powers are applied to the susceptor 105 and the upper electrode 121, respectively. The high-frequency power applied to the upper electrode 121 and that applied to the susceptor 105 are set at, for example, 650 W and 220 W, respectively. By respectively applying the high-frequency powers to the upper electrode 121 and the susceptor 105, the nature oxide on the exposed surface of the polysilicon film 304 is removed.

A main etching step is carried out to etch the polysilicon film 304 in a depth direction in an opening portion of the hard mask layer 306 (mask pattern).

In this main etching step, the polysilicon film 304 is etched in the depth direction in the opening portion of the mask pattern using a mixture gas containing at least HBr and $O_2$ as a treatment gas. The polysilicon film 304 is etched by a depth of, for example, 85% of an original film thickness.

Conditions for the main etching step are, for example, the internal pressure of the chamber 102 of 20 mTorr, the distance between the upper electrode 121 and the susceptor 105 of 140 mm, and the gas flow ratio of $HBr/O_2$ (gas flow of HBr to gas flow of $O_2$) of 400 sccm/1 sccm. In addition, the voltage applied to the electrostatic chuck 110 for attracting the wafer thereon is set at 2.5 kV, and the pressure of the gas for cooling the rear surface of the wafer W is set at 3 mTorr both at the center and the edge of the rear surface. As for the settings of the temperatures in the chamber 102, the temperature of the lower electrode is set at 75° C., that of the upper electrode is set at 80° C., and that of the sidewall is set at 60° C.

In the main etching step, relatively high frequency powers are applied to both the susceptor 105 and the upper electrode 121, respectively. The high-frequency powers applied to the upper electrode 121 and the susceptor 105 are set at, for example, 200 W and 100 W, respectively. By respectively applying the high-frequency powers to the upper electrode 121 and the susceptor 105, the polysilicon film 304 located in the opening portion of the hard mask layer 306 is selectively etched away as shown in FIG. 5A, and a hole H is formed in the polysilicon film 304. As the etching is further progressed, the hole H is deeper as shown in FIG. 5B.

The etching system 100 according to this embodiment operates as follows so as to detect the etch amount of the polysilicon film 304, that is, a depth of the hole H during the etching process using the hard mask layer 306.

The light source 206 belonging to the etch amount detecting apparatus 200 emits the light La (see FIG. 2). This light La is irradiated onto the wafer through the optical fiber 204, the condenser lens 202, and the observation section 160.

As shown in FIGS. 5A and 5B, a part of the light La is transmitted by the hard mask layer 306, reaches the interface between the hard mask layer 306 and the polysilicon film 304, and is reflected by the interface. The reflected light La11 of the light La is transmitted by the hard mask layer 306 and emitted outside.

The other part of the light La is reflected by a bottom of the hole H which is the etching target portion of the polysilicon film 304. The reflected light La12 of the light La interferes with the reflected light La11 to generate an interference light.

The interference light obtained by the reflected lights La11 and La12 is passed through the observation section 160, the condenser lens 202, and the optical fiber 204, and detected by the polychrometer 208.

As can be seen, as the hole H is deeper as shown in FIGS. 5A and 5B, an intensity of the interference light detected by the polychrometer 208 cyclically fluctuates. The operation section 210 calculates the etch amount (the depth of the hole H) of the polysilicon film 304 at real time based on the change in the intensity of the interference light. The control section 220 controls the first radio frequency power source 140, the first matching section 141, the second radio frequency power source 150, and the second matching section 151 in accordance with the operation result. When it is determined that the bottom of the hole H reaches a predetermined depth as a result of the operation of the operation section 210, the etching process to the polysilicon film 304 is finished. The etch rate at which the polysilicon film 304 is etched may be adjusted based on the operation result of the operation section 210.

According to this etch amount detecting method, the depth of the hole H is detected with the interface between the hard mask layer 306 and the polysilicon film 304 set as a reference. The absolute height of the interface between the hard mask layer 306 and the polysilicon film 304 is constant without any influence of the etching. Therefore, even if the thickness of the hard mask layer 306 is irregular before etching, or even if the upper surface of the hard mask layer 306 is scraped off (scrape amount of D11) following the etching process to the polysilicon film 304 as shown in FIG. 5B, the depth of the hole H is accurately detected.

Meanwhile, a cycle of the change in the intensity of the interference light obtained by the reflected lights La11 and La12 during the etching process to the polysilicon film 304 depends on a wavelength of the light La emitted from the light source 206. If the wavelength of the light La is large, the cycle of the change in the intensity of the interference light is slow, with the result that the depth of the hole H cannot be calculated with high accuracy. In this respect, the wavelength of the light La is set at a relatively small wavelength of 261 nm according to this embodiment. Therefore, the etching process for creating the hole H can be controlled more strictly.

As can be seen, it is preferable to use the light La at a small wavelength so as to detect the etch amount. However, depending on the type of the mask layer formed on the polysilicon film 304 and serving as the etching target layer, the wavelength of the light La is restricted. The typical example of the type of the mask layer which causes the restriction of the wavelength of the light La is the mask layer consisting of the photoresist material.

As shown in FIGS. 5A and 5B, if the wafer includes the hard mask layer 306 consisting of the silicon oxide material ($SiO_2$) or the silicon nitride material ($Si_3N_4$), then the light La at the wavelength of 261 nm is transmitted by the hard mask layer 306, and reaches the interface between the hard mask layer 306 and the polysilicon film 304. If the wafer includes the photoresist mask layer 316 consisting of the photoresist material, the light La at the wavelength of 261 nm may not possibly be transmitted by the photoresist mask layer 316. This is because the photoresist material normally has a high absorption coefficient relative to a wavelength region including the wavelength of 261 nm.

If etching the wafer including the photoresist mask layer 316, the etching system 100 according to this embodiment, therefore, detects the etch amount by a different method from the case of etching the wafer including the hard mask layer 306. The etching process operation carried out to the wafer including the photoresist mask layer 316 shown in FIG. 4 and the etch amount detection operation carried out in parallel to the etching process operation will be described.

(Etching Process when Mask Layer is Photoresist Mask Layer)

The wafer including the photoresist mask layer 316 is subjected to the breakthrough etching process and the main etching process under the same conditions as the etching process conditions for the wafer including the hard mask layer 306. As a result, the nature oxide on the exposed surface of the polysilicon film 304 is removed, the polysilicon film 304 located in the opening portion of the photoresist mask layer 316 is selectively etched away as shown in FIG. 6A, and the hole H is formed in the polysilicon film 304. As the etching is further progressed, the hole H is deeper as shown in FIG. 6B.

The etching system 100 according to this embodiment operates as follows so as to detect the etch amount of the polysilicon film 304, that is, the depth of the hole H during the etching process using the photoresist mask layer 316.

The light source 206 belonging to the etch amount detecting apparatus 200 emits the light La (first light) and the light Lb (second light) (see FIG. 2). The lights La and Lb have different wavelengths. In this embodiment, the wavelength of the light La is 261 nm, and that of the light Lb is 387 nm. The lights La and Lb are passed through the optical fiber 204, the condenser lens 202, and the observation section 160, and irradiated onto the wafer W.

Figure 6B:
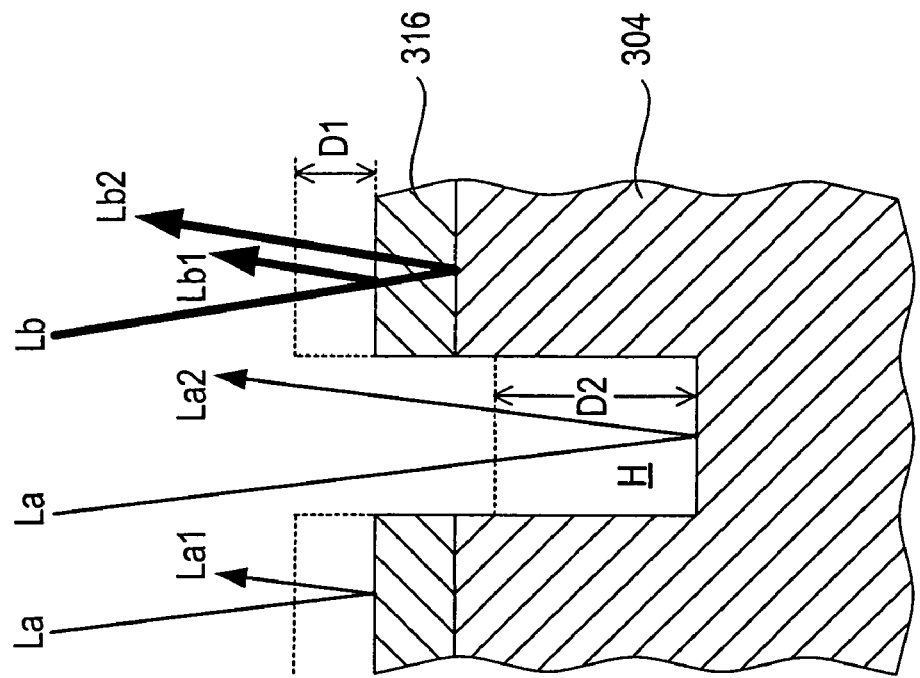
FIGS. 6A and 6B are explanatory views which depict light reflection states when the polysilicon film of the wafer shown in FIG. 4 is etched.
Figure 6A:
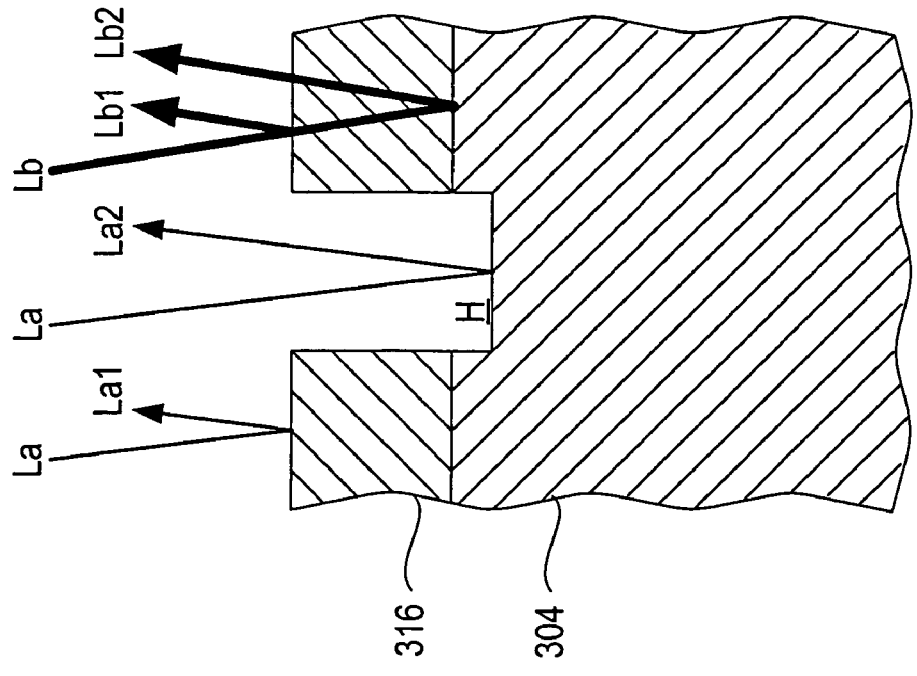

As shown in FIGS. 6A and 6B, a part of the light La is reflected by the upper surface of the photoresist mask layer 316, and the reflected light La1 (first reflected light) is obtained. The other part of the light La is reflected by the bottom of the hole H serving as the etching target portion of the polysilicon film 304, and the reflected light La2 (second reflected light) is obtained. The reflected lights La1 and La2 interfere with each other to generate the interference light Lai (first interference light). In this embodiment, a light absorption band of the photoresist mask layer 316 includes the wavelength 261 nm of the light La. Therefore, the light La is not transmitted by the photoresist mask layer 316, and the reflected light of the light La is not obtained on the interference between the photoresist mask layer 316 and the polysilicon film 304.

The Lb has the wavelength of 387 nm larger than the wavelength 261 nm of the light La. Due to this, a part of the light Lb is transmitted by the photoresist mask layer 316, reaches the interface between the photoresist mask layer 316 and the polysilicon film 304, and is reflected by the interface. The reflected light Lb1 (third reflected light) of the light Lb is transmitted by the photoresist mask layer 316, and emitted outside.

The other part of the light Lb is reflected by the upper surface of the photoresist mask layer 316. The reflected light Lb2 (fourth reflected light) of the light Lb interferes with the reflected light Lb1 to generate the interference light Lbi (second interference light).

The interference light Lai obtained by the reflected lights La1 and La2 and the interference light Lbi obtained by the reflected light Lb1 and Lb2 are passed through the observation section 160, the condenser lens 202, and the optical fiber 204, and detected by the polychrometer 208.

Figure 7:
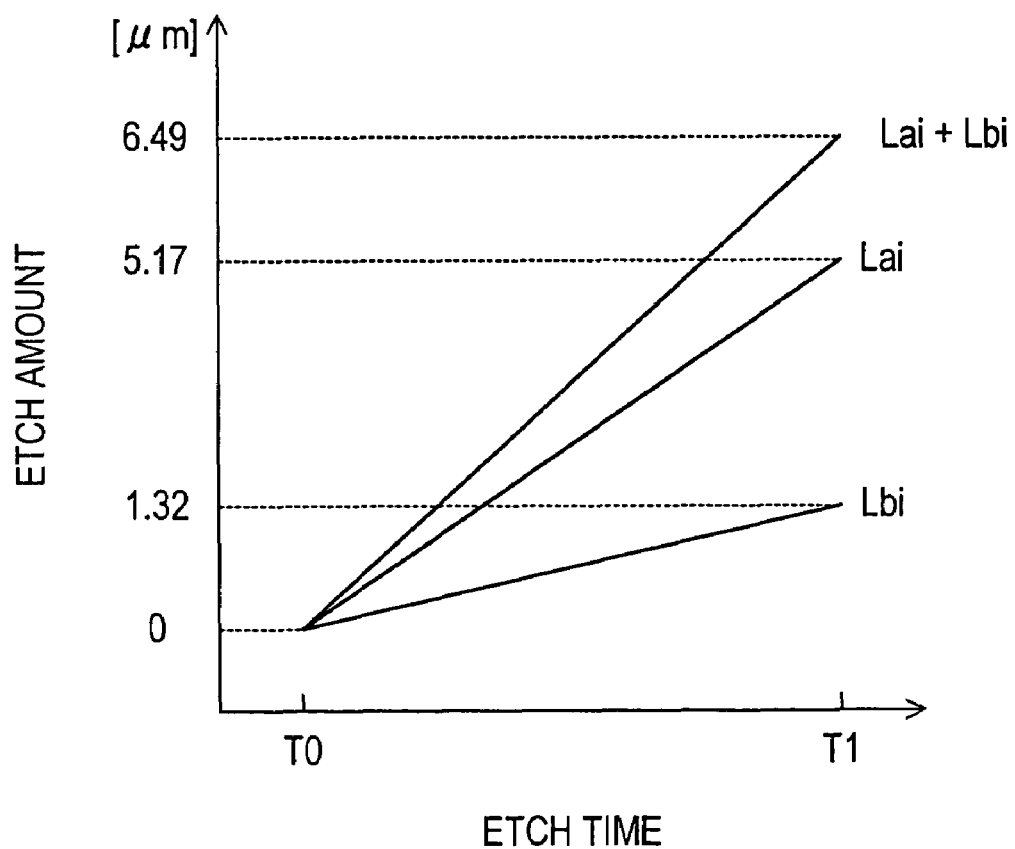
FIG. 7 depicts a relationship between etch time and etch amount when the polysilicon film of the wafer shown in FIG. 4 is etched.

The intensity of the interference light Lai detected by the polychrometer 208 cyclically fluctuates as the hole H is deeper as shown in FIGS. 6A and 6B. The operation section 210 calculates the etch amount of the polysilicon film 304 (the depth of the hole H) at real time based on the change in the intensity of the interference light Lai. A result of calculating the etch amount D2 of the polysilicon film 304 by the operation section 210 based on the change in the intensity of the interference light Lai is shown in FIG. 7.

According to this embodiment, the result of the operation based on the change in the intensity of the interference light Lai indicates that the etching to the polysilicon 304 starts at a time T0 and that the etch amount reaches 5.17 µm at a time T1. However, the real etch amount of the polysilicon film 304 cannot be obtained from the result of the operation based on the change in the intensity of the interference light Lai for the following reason.

The interference light Lai is obtained by the reflected light La1 reflected by the upper surface of the photoresist mask layer 316 and the reflected light La2 reflected by the bottom of the hole H. To calculate the absolute height of the bottom of the hole H, therefore, it is requisite that the height of the upper surface of the photoresist mask layer 316 be constant.

However, since the surface of the photoresist mask layer 316 is also exposed to the etching gas used to generate the hole H in the polysilicon film 304, there is no avoiding etching the photoresist mask layer 316. Besides, the etch rate of etching the photoresist mask layer 316 is faster than that of etching the hard mask layer 306. When the bottom of the hole H of the polysilicon film 304 reaches the depth D2, the upper surface of the photoresist mask layer 316 is relatively greatly scraped off (a scrape amount D1). Namely, the result of calculation based only on the change in the intensity of the interference light Lai includes the scrape amount D1 of the upper surface of the photoresist mask layer 316.

According to this embodiment, therefore, not only the change in the intensity of the interference light Lai but also the change in the intensity of the interference light Lbi are taken into consideration so as to calculate the etch amount of the polysilicon film 304.

The intensity of the interference light Lbi detected by the polychrometer 208 cyclically fluctuates as the upper surface of the photoresist mask layer 316 is scraped off as shown in FIGS. 6A and 6B. The operation section 210 calculates the scrape amount D1 of the photoresist mask layer 316 at real time based on the change in the intensity of the interference light Lbi. A result of calculating the scrape amount D1 of the photoresist mask layer 316 by the operation section 210 based on the change in the intensity of the interference light Lbi is shown in FIG. 7.

The result of the operation based on the change in the intensity of the interference light Lbi indicates that the photoresist mask layer 316 is scraped off by 1.32 µm between the time T0 and the time T1 according to this embodiment. The scrape amount D1 of the photoresist mask layer 316 is calculated with the interface between the photoresist mask layer 316 and the polysilicon film 304 set as a reference. The interface between the photoresist mask layer 316 and the polysilicon film 304 is not influenced by the etching, so that the absolute height of the interface is constant. Accordingly, even if the thickness of the photoresist mask layer 316 is irregular before etching, the scrape amount D1 of the photoresist mask layer 316 is calculated accurately.

The operation section 210 belonging to the etch amount detecting apparatus 200 calculates the real etch amount of the polysilicon film 304 (the absolute depth D2 of the hole H) by adding the etch amount (scrape amount D1) of the photoresist mask layer 316 obtained based on the change in the intensity of the interference light Lbi to the position of the bottom of the hole H (difference in height between the upper surface of the photoresist mask layer 316 and the bottom of the hole H) obtained based on the change in the intensity of the interference light Lai. According to this embodiment, the etch amount of the polysilicon film 304 at the time T1 is 6.49 (=5.17+1.32) µm as shown in FIG. 7.

The control section 220 controls the first radio frequency power source 140, the first matching section 141, the second radio frequency power source 150, and the second matching section 151 according to this operation result. When it is determined that the bottom of the hole H reaches a predetermined depth as a result of the operation of the operation section 210, the etching process to the polysilicon film 304 is finished. The etch rate of etching the polysilicon film 304 may be adjusted based on the result of the operation of the operation section 210.

The present embodiment has been described so far, referring to the instance in which the wavelength of the light La is 261 nm and that of the light Lb is 387 nm. However, according to the present invention, the respective wavelengths of the lights are not limited to those shown in this instance. The wavelengths are preferably set based on the following viewpoints.

In order to highly accurately calculate the etch amount of the polysilicon film 304, the smaller wavelength of the light La is more advantageous. However, it is necessary to select the wavelengths so that a reflectance of the upper surface of the photoresist mask layer 316 and that of the bottom of the hole H are high. This is because if reflected lights from the other regions are dominantly present, it is difficult to detect the interference light Lai.

Further, the light Lb is used to detect the scrape amount D1 of the photoresist mask layer 316. The wavelength of the light Lb is, therefore, preferably selected so that the reflectance is higher on the interface between the photoresist mask layer 316 and the polysilicon film 304. To cause the light Lb to be reflected by the interface between the photoresist mask layer 316 and the polysilicon film 304, and to extract the reflected light Lb2 of the light Lb from the upper surface of the photoresist mask layer 316, in particular, it is necessary to find the light Lb at the wavelength which is not included in the absorption band of the photoresist mask layer 316.

Generally, a wavelength of an exposure light used when forming the photoresist mask layer 316 is located at a longest wave side of the absorption band of the photoresist mask layer 316. In other words, the photoresist material that constitutes the photoresist mask layer 316 is selected and adjusted so that the absorption band of the photoresist mask layer 316 matches with the wavelength of the exposure light. This indicates as follows. If the wavelength of the light Lb is adjusted to the long wave side with reference to the photosensitive wavelength of the photoresist material that constitutes the photoresist mask layer 316, then the light Lb arrives at the interface between the photoresist mask layer 316 and the polysilicon film 304 without being absorbed by the photoresist mask layer 316, and reflected by the interface. In addition, the reflected light Lb2 is extracted from the upper surface of the photoresist mask layer 316 without being absorbed by the photoresist mask layer 316.

In order to highly accurately detect the scrape amount D1 of the photoresist mask layer 316, however, the wavelength of the light Lb is preferably as small as possible. If a material photosensitive to an i-line (at a wavelength of 365 nm) of the xenon lamp is used as the photoresist material that constitutes the photoresist mask layer 316, as the embodiment, then the wavelength of the light Lb is set to be larger than the wavelength of the i-line and to be close to this wavelength, e.g., set at 387 nm. The light Lb at the wavelength of 387 nm is obtained by, for example, an $N_2$ laser.

As stated above, according to this embodiment, the difference in height between the upper surface of the photoresist mask layer 316 and the bottom of the hole H is calculated during the etching process to the polysilicon film 304, and the scrape amount D1 of the photoresist mask layer 316 is calculated. By operating (adding up) these values, the real etch amount of the polysilicon film 304 is detected with high accuracy at real time.

According to this embodiment, the two lights of La and Lb are used to detect the etch amount of the polysilicon film 304. Among these lights, the light Lb at a relatively large wavelength is transmitted by the mask layer. Due to this, it is unnecessary to cause the light La to be transmitted by the mask layer, and the wavelength of the light La can be set smaller, accordingly. Therefore, even if a reduction in the size of a mask pattern is accelerated, an inside diameter of the hole H is smaller or the hole H is deeper, the etch amount of the polysilicon film 304 can be detected with high accuracy.

The preferred embodiment of the present invention has been described so far with reference to the accompanying drawings. The present invention is not, however, limited to the preferred embodiment. It is obvious that a person having ordinary skill in the art could be easily motivated to attain various changes and modifications to the invention within a scope of the technical concept described in the claims which follow. It is interpreted that these changes and modifications are, quite naturally, also within the technical scope of the present invention.

For example, the embodiment of the present invention has been described while referring to the instance of etching the polysilicon film 304 (silicon-containing film). However, the present invention can be applied to the other etching target layer.

Further, the present invention is not limited to the instance in which the mask layer on the etching target layer consists of the photoresist material. For example, as shown in FIGS. 5A and 5B, the present invention is also applicable to the instance in which the mask layer is the hard mask layer 306. Since the light La is hardly absorbed by the hard mask layer 306, the etch amount of the polysilicon film 304 can be detected only with the light La as stated above. However, if the stricter detection result of the etch amount is required, it is preferable to detect the scrape amount D11 of the hard mask layer 306 using the light Lb. If the scrape amount D11 of the hard mask layer 306 (thickness of the hard mask layer 306) is considered when calculating the etch amount of the polysilicon film 304 based on the change in the intensity of the reflected light La11, the etch amount of the polysilicon film 304 can be detected more accurately.

In addition, three or more lights can be irradiated onto the wafer, and the etch amount of the etching target layer can be detected using interference lights obtained from reflected lights of the respective three or more lights. This modification is effective when, for example, a plurality of layers are present on the etching target layer.

Furthermore, the embodiment of the present invention has been described while referring to the instance in which the photoresist material that constitutes the photoresist mask layer 316 is photosensitive to the i-line (at the wavelength of 365 nm). The present invention is similarly applicable to an instance in which the photoresist material is photosensitive to a KrF excimer laser light (at a wavelength of 248 nm), an ArF excimer laser light (at a wavelength of 193 nm), or an $F_2$ excimer laser light (at a wavelength of 157 nm).

As stated so far in detail, the present invention can detect the etch amount of the etching target layer with high accuracy at real time, irrespective of the type of the mask layer.

What is claimed is:

1. An etch amount detection method for detecting an etch amount of an etching target layer when an etching process is carried out to the etching target layer on an object to be processed while using a patterned mask layer as a mask, the method comprising steps of:

irradiating a first light having a first wavelength, which does not propagate the mask layer, and a second light having a second wavelength, which is different from said first wavelength and propagates the mask layer, onto said object to be processed;

detecting a first interference light generated by interference of a first reflected light obtained when said first light is reflected by a surface of said mask layer with a second reflected light obtained when said first light is reflected by a bottom of an etching target portion etched of said etching target layer;

detecting a second interference light generated by interference of a third reflected light obtained when said second light is reflected by the surface of said mask layer with a fourth reflected light obtained when said second light is reflected by an interface between said mask layer and said etching target layer; and calculating an etch amount of said etching target portion based on said first interference light and said second interference light.

2. The etch amount detection method according to claim 1, wherein said mask layer consists of a photosensitive material, said first wavelength is smaller than a photosensitive wavelength of said photosensitive material, and said second wavelength is larger than the photosensitive wavelength of said photosensitive material.

3. The etch amount detection method according to claim 2, wherein said photosensitive material is a type photosensitive to a light having a wavelength of 365 nm, said first wavelength is 261 nm, and said second wavelength is 387 nm.

4. The etch amount detection method according to claim 1, wherein the step of calculating the etch amount of said etching target portion based on said first interference light and said second interference light includes steps of:

calculating a difference in height between the surface of said mask layer and the bottom of said etching target portion based on said first interference light;

calculating an etch amount of said mask layer based on said second interference light; and adding the etch amount of said mask layer to the difference in height between the surface of said mask layer and the bottom of said etching target portion.

5. The etch amount detection method according to claim 1, wherein said etching target layer consists of a silicon-containing film.

6. The etch amount detection method according to claim 5, wherein said silicon-containing film is a polysilicon film.

7. An etching method for etching an etching target layer on an object to be processed while using a patterned mask layer as a mask, the method comprising steps of:
- irradiating a first light having a first wavelength, which does not propagate the mask layer, and a second light having a second wavelength, which is different from said first wavelength and propagates the mask layer, onto said object to be processed;
- detecting a first interference light generated by interference of a first reflected light obtained when said first light is reflected by a surface of said mask layer with a second reflected light obtained when said first light is reflected by a bottom of an etching target portion etched of said etching target layer;
- detecting a second interference light generated by interference of a third reflected light obtained when said second light is reflected by the surface of said mask layer with a fourth reflected light obtained when said second light is reflected by an interface between said mask layer and said etching target layer; and
- calculating an etch amount of said etching target portion based on said first interference light and said second interference light.

8. The etching method according to claim 7, wherein
said mask layer consists of a photosensitive material,
said first wavelength is smaller than a photosensitive wavelength of said photosensitive material, and
said second wavelength is larger than the photosensitive wavelength of said photosensitive material.

9. The etching method according to claim 8, wherein
said photosensitive material is a type photosensitive to a light having a wavelength of 365 nm,
said first wavelength is 261 nm, and
said second wavelength is 387 nm.

10. The etching method according to claim 7, wherein
the step of calculating the etch amount of said etching target portion based on said first interference light and said second interference light includes steps of:
- calculating a difference in height between the surface of said mask layer and the bottom of said etching target portion based on said first interference light;
- calculating an etch amount of said mask layer based on said second interference light; and
- adding the etch amount of said mask layer to the difference in height between the surface of said mask layer and the bottom of said etching target portion.

11. The etching method according to claim 7, wherein
said etching target layer consists of a silicon-containing film.

12. The etching method according to claim 11, wherein
said silicon-containing film is a polysilicon film.

* * * * *